Figure 1:
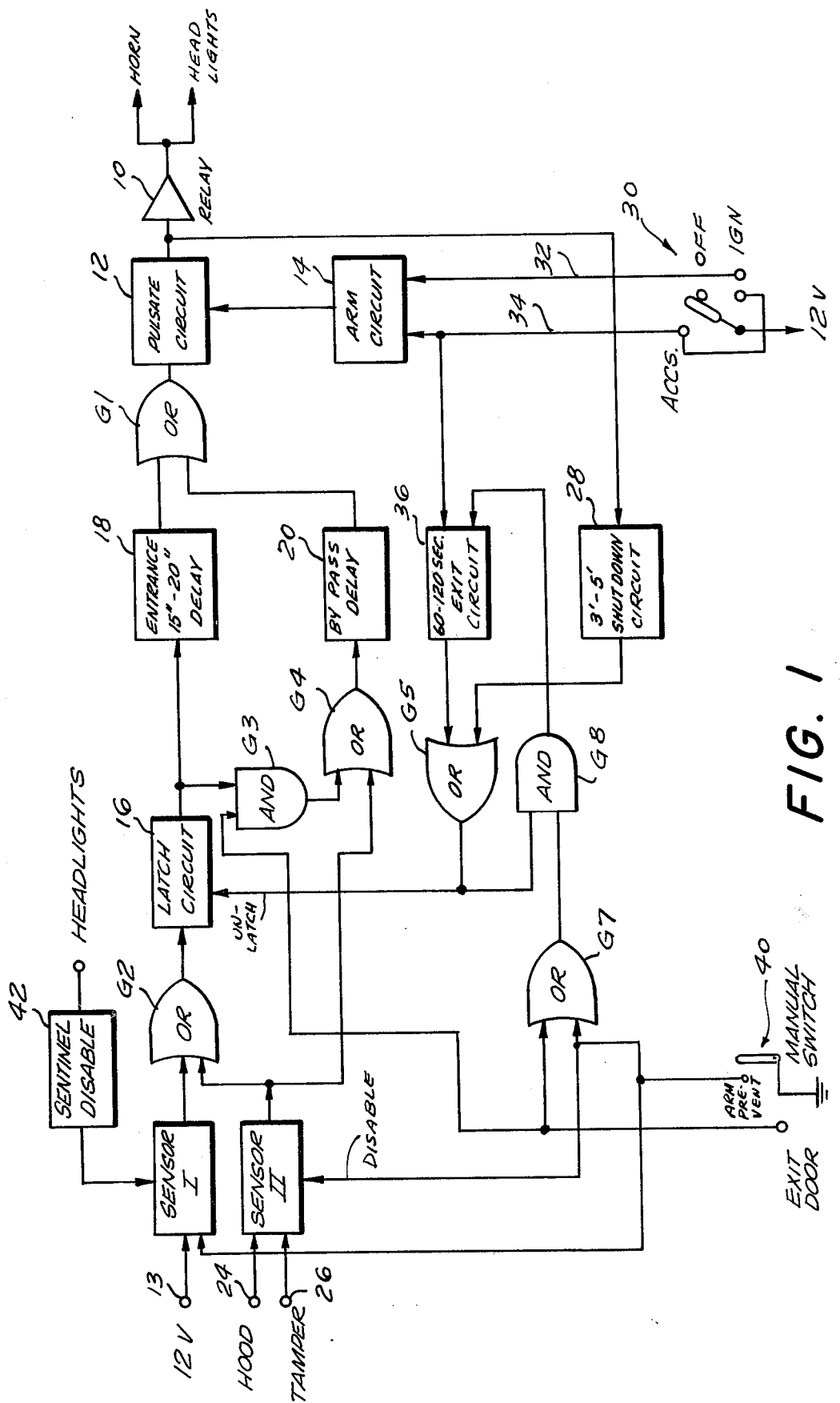

United States Patent [19]
Teich

[11] 3,956,732
[45] May 11, 1976

[54] AUTOMOBILE THEFT ALARM WITH IGNITION CONTROLLED AUTOMATIC ARMING MEANS

[76] Inventor: Rudor M. Teich, 6040 Blvd. East, West New York, N.J. 07093

[22] Filed: Jan. 2, 1973

[21] Appl. No.: 320,542

Related U.S. Application Data

[63] Continuation-in-part of Ser. No. 217,181, Jan. 12, 1972, Pat. No. 3,740,713, which is a continuation-in-part of Ser. No. 86,222, Nov. 2, 1970, Pat. No. 3,671,934.

[52] U.S. Cl. .............................. 340/64; 307/10 AT; 180/114
[51] Int. Cl.² ......................................... B60R 25/10
[58] Field of Search .............. 340/63, 64, 276, 274, 340/213; 307/10 AT; 180/114

[56] References Cited
UNITED STATES PATENTS
3,774,191  11/1973  Enemark.............................. 340/274

*Primary Examiner*—John W. Caldwell
*Assistant Examiner*—Joseph E. Nowicki

[57] ABSTRACT

A vehicle warning system is automatically armed via the ignition switch each time the ignition is turned off and the key removed so that no positive action of the driver is required. The system may be disabled between authorized uses of the vehicle through the ignition switch by turning to the accessory position. However, the arming circuit is so designed that the procedure may be reversed merely by reversing a lead connection at the time of installation.

The system is equipped with two sensing circuits one of which is adapted to sense the energization of a resistive load device and the other of which directly senses the opening of the hood and/or the tampering with selected areas of the vehicle protected by a closed loop circuit. A novel latching circuit is designed to selectively provide holding current for a latching SCR operatively connecting both sensing circuits to the alarm energizing circuitry and includes a field effect transistor controlled by the voltage level at its gate terminal provided through an RC network. That network provides a relatively long exit delay upon turning off the ignition during which the circuit will not latch in addition to an automatic alarm shutoff feature designed to unlatch the circuit after it has sounded for approximately five minutes. Manual switch means operatively connected to the aforementioned latching circuit is provided for permanently preventing the circuit from latching thereby to disable the circuit on a continuous basis without compromising the security of the circuit.

The alarm energizing circuitry is provided with an inherent entrance delay with means to bypass that delay when the cause of the alarm is other than the opening of a door of the vehicle. In addition, means are provided for bypassing the entrance delay and latching circuit completely regardless of the condition of the vehicle door in response to the actuation of the hood and tamper sensing circuit.

Finally, means are provided for maintaining the rate-of-change of battery voltage sensor insensitive to the turnoff of the vehicle headlights to account for delayed automatic headlight turn-off as is found in some late model vehicles.

5 Claims, 3 Drawing Figures

FIG. 2B

AUTOMOBILE THEFT ALARM WITH IGNITION CONTROLLED AUTOMATIC ARMING MEANS

CROSS REFERENCE

This application is a continuation-in-part of my copending application Ser. No. 217,181, now U.S. Pat. No. 3,740,713, filed Jan. 12, 1972, entitled "Automobile Theft Alarm with Ignition Controlled Automatic Arming Means" which application is in turn a continuation-in-part of my application Ser. No. 86,222 filed Nov. 2, 1970, and entitled "Automobile Theft Alarm for Detecting Unauthorized Energization of Resistive Load", now U.S. Pat. No. 3,671,934.

This invention relates to warning systems and more particularly to an automatically armed vehicle alarm circuit controlled by the vehicle ignition switch.

BACKGROUND OF THE INVENTION

The theft of automobiles and of property from parked automobiles represents one of the more significant areas of criminal activity. As the use of automobiles has increased, so has the incidence of thefts involving automobiles. The economic impact of automobile larceny is reflected in part in the increased rates of automobile insurance, and the disproportionate number of automobile accidents involving stolen automobiles in which the unauthorized drivers are often minors. It is also a common practice for thieves to forcibly enter a parked automobile to pilfer articles such as luggage and radios, and in case of an automobile belonging to a doctor, as indicated by the license plate, medical bags hopefully, in the eyes of the thief, containing narcotics.

The provision of an alarm actuated upon the unauthorized opening of the car door of the automobile, or the operation of any electrically controlled device in the automobile, constitutes an effective deterrent against thefts of this type. The sound of a wailing siren or horn almost certainly upsets the plans of the would-be car thief, and quickly attracts the attention of the police and others.

Alarms of this type have been proposed and are in widespread use on trucks carrying large quantities of goods often having considerable value. The warning alarm, which has as its main object the protection of goods, generally comprises a plurality of switches which are responsive to the unauthorized opening of doors or the like, and which when actuated, energize a relay to in turn energize a warning device such as a siren. Apparatus of this type requires the installation of a large number of components in the vehicle, such as the switches, relays, etc., and as a result, the cost of purchasing and installing such apparatus is generally high. Owners and operators of trucks are usually willing and able to pay this because the potential saving in insurance premiums, and the increased protection of their customers' products and the accompanying customer good will, make the cost of a warning device of this type well worthwhile.

The acceptance and use of such warning devices by owners of automobiles has, however, been greatly limited, largely as a result of the high initial purchase cost and the difficulty of installation. The known alarm devices adapted for use in automobiles have the further drawback of being not always reliable, and in that the failure of the device often results in the failure of the automobile's electrical system.

More recently, vehicle alarm systems have been developed which are directly responsive to the energization of a load device such as a dome light resulting from unauthorized entry of the vehicle. In some systems, a current sensitive device is interposed between the battery and the load device and is effective upon energization of that load device (by the opening of a door or trunk) to energize a latching relay or switch, thereby to activate the alarm. Systems of this type, while they are somewhat less complex and expensive than the systems mentioned above, nevertheless have several drawbacks. For example, they are difficult to install because the accessory leads must be opened in order to install the one or more current sensitive devices. Moreover, a failure of the thus installed current sensing device may produce a failure of one or more load devices or in some cases failure of the entire electrical system of the vehicle.

A second category of system of this type is sensitive to the voltage level at the battery and is adapted to detect unauthorized entry by sensing a voltage dip at the battery terminals resulting from the energization of a load device and is adapted to activate the alarm in response thereto. While these systems are easier to install, they are frequently subject to false alarms. Thus, because the sensing circuit is responsive only to battery voltage magnitude, it will respond to all fluctuations, including those not associated with unauthorized entry. As a result, systems of this type are often activated by such events as nearby radio transmission, extremes of temperature, changes within the battery itself, and even the winding of a conventional automobile clock.

In my aforementioned U.S. Pat. No. 3,671,934, I disclose a vehicle alarm circuit which is responsive only to the rate-of-change of voltage at the battery terminals. Accordingly, that circuit discriminates between resistive loads normally associated with unauthorized use of the vehicle and inductive loads, resulting from extraneous events. That alarm system, accordingly, represents a substantial improvement over prior art vehicle warning devices in that it combines exceptional reliability at low cost with relatively easy installation.

All known vehicle alarm systems, including my most recent "rate-of-change of battery voltage" sensing system described above, are provided with manually actuated means for arming the alarm, typically in the form of a simple switch. The switch may be accessible from the outside of the vehicle, in which case it is key actuated, or it may be located in a suitable location within the vehicle. In the latter case, time delay means may be provided to allow entrance by the authorized user without activating the alarm. In either case, however, the alarm circuit must be completely deactivated prior to authorized use of the vehicle and will not be effective upon the driver's leaving the vehicle unless reactivated at that time. Stated in other terms, in all prior art vehicle warning systems the choice of arming the alarm circuit is left to the driver. The presumed necessity of this feature has in the past been perhaps the major obstance to the effectiveness of vehicle alarm systems. Thus, the most sophisticated warning system is completely useless if the driver does not arm it. Consequently, while prior art vehicle alarm systems are today fairly widespread, drivers quite often inadvertently forget to arm them or consciously forego arming in situations in which they (normally unjustifiably) feel the chance of unauthorized entry is minimal. As a result, insurance companies place very little stock in such systems and their widespread use has not been effective in lowering high insurance rates.

The above mentioned problems have been satisfactorily solved by the alarm system described in my aforementioned copending application Ser. No. 217,181, which combines a battery voltage "rate-of-change" sensor with a unique automatic arming system controlled by the ignition switch of the vehicle. Briefly, that system employs a unique pulse generator circuit adapted to energize an alarm device (normally the horn) in pulse fashion in response to an alarm signal provided by the rate-of-change sensor. That alarm signal is effective to trigger a latching circuit connected in operative circuit arrangement with the pulse generator circuit. The pulse generator is designed with a built-in initial capacitive time delay, so that unlatching of the latch circuit within such initial delay effectively prevents energization of the alarm. Means are provided for unlatching the latching circuit when the ignition switch is turned, by means of the ignition key, to the ignition position. Accordingly, the aforementioned delay provided by the pulse generator circuit provides sufficient time to enable the driver to enter and start the vehicle thereby temporarily disabling the alarm.

In addition, means are provided, again responsive to the ignition switch, for inhibiting the sensing circuit when the vehicle is being operated, thereby to prevent momentary alarm actuation in response to the energization of load devices such as lights, cigarette lighter, radio, etc. That inhibiting circuit is provided with means to maintain the sensing circuit insensitive to battery voltage fluctuations for a predetermined time after the ignition switch is turned to the off position, thereby to afford an exit delay sufficient to allow the driver to leave the vehicle with activating the alarm.

The pulse generating circuit, however, remains armed unless positively disarmed by the driver. For this latter purpose there are provided pulse inhibit and permanent disarm circuits operatively connected to the pulse generator circuit, the combined effect of which is to disarm the circuit only when the ignition switch is turned to the accessory position and maintained in that position for a predetermined time. After such predetermined interval, if the ignition switch is turned off, the alarm remains disabled, the pulse generator circuit having been shorted out. However, the pulse generator circuit is automatically returned to its initial enabled condition when the ignition switch is next turned to the start position. As a result, when the ignition switch is thereafter turned off, the circuit is automatically armed after the expiration of the exit delay. The aforementioned arming circuit, including pulse inhibit and permanent disarm subcircuits, is effective to provide automatic arming but this feature is attained with considerable complexity in the circuitry which increases expense.

Nevertheless, the above described alarm system represents a major advance in vehicle warning systems as a result of its completely automatic operation including automatic arming and entrance and exit delays. Notwithstanding its unique and desirable features, however, this system is still deficient in several additional important respects.

First, it will be appreciated that a rate-of-change of battery voltage sensor is limited in its effective protection to those modes of entry and/or tampering which involve the energization of a resistive load device. Thus, while the alarm will respond to normal entry by the doors or trunk (with which courtesy lights are normally associated), special provision must be made, for example, for the hood, which normally does not come equipped with a lamp. In addition, the battery voltage sensor is not effective to detect forcible entry through other areas of the vehicle such as by breaking a window. In this regard, some automobiles now come originally equipped with a protective loop or other protective circuitry adapted to be operatively connected to an alarm system for sensing attack on the thus protected elements of the vehicle.

Moreover, even if all likely areas of entry and/or tampering are adapted to be sensed, the built-in entrance delay of the aforementioned system will in many cases afford the intruder sufficient time either to abscond with the stolen property (i.e. from the trunk) or to deactivate the entire electrical system of the vehicle, for example, by opening the hood and disconnecting the battery terminals.

A second obvious limitation of my aforementioned system is that there is no way for the authorized driver to disable the alarm on a continuous basis—the system is automatically rearmed after each use of the vehicle unless specifically disarmed. While this feature insures active use of the alarm system, it may become a nuisance under certain conditions—for example where the driver is making several stops for pickup or delivery without leaving the vehicle unattended. It is therefore desirable to provide means for permanently disabling the alarm without, however, compromising the security of the system.

Another source of difficulty in my aforementioned circuit is that once the alarm is initiated, it will continue until shut off with the ignition key. An attempted burglary will generally be thwarted by the alarm in a matter of seconds or at most minutes. Thereafter the continuing of the alarm results in unnecessary noise which at best will drain the vehicle battery and at worst will result in damage to the vehicle by neighbors or police in an effort to stop the alarm. In the past, this problem has been avoided by automatic shutoff systems. However, prior art systems of this type unavoidably compromise the security of the system since the alarm is not automatically rearmed after it has run its course—a second attempt at entry will succeed.

Finally, in all prior art vehicle alarm systems with exit delays, it has been found that the system is too unflexible. For example, the unloading of goods from the vehicle may extend beyond the interval of the exit delay and the subsequent transient resulting from the closing of the door may activate the alarm. Similarly, many vehicles now come equipped with an option which maintains the headlights operative for a period of 3–4 minutes after the ignition has been turned off to illuminate the way. It has been found that in my aforementioned system the transient associated with the automatic shutoff of the headlights after this period may falsely activate the alarm. Accordingly, it is desirable to provide safeguards against alarm activation under these circumstances.

It is a primary object of the present invention to provide a vehicle alarm system having an improved arming circuit which is simple, inexpensive and reliable and provides automatic rearming after each authorized use of the vehicle without any positive action of the driver.

It is another object of the present invention to provide an ignition controlled alarm circuit of the type described including auxiliary manually actuatable control means effective to prevent automatic rearming but ineffective to disarm the system once armed, thereby to provide flexibility without compromising security.

It is yet another object of the present invention to design a vehicle alarm system of the type described including an entrance delay in alarm activation which is conditional upon the mode of entry, said delay being bypassed by unauthorized entry or tampering without opening of the vehicle door.

It is still another object of the present invention to provide an alarm circuit for a vehicle security system including two separate sensing circuits one of which is adapted to sense the energization of a resistive load device and the other of which directly senses tampering and/or entry at specific locations on the vehicle, those circuits being connected in parallel and each being effective to initiate an alarm.

It is yet another object of the present invention to design a vehicle alarm circuit of the type described including an exit delay which is responsive to the condition of the vehicle door.

It is still another object of the present invention to provide a vehicle alarm system of the type described including means to prevent alarm activation in response to an automatic headlight turnoff after the ignition is turned off.

It is still another object of the present invention to design a vehicle alarm system with means to automatically shut off the alarm a predetermined interval after it is initiated, and to automatically rearm the circuit upon such shutoff.

To these ends, the present invention comprises a vehicle alarm system of the general type described in my aforementioned copending application Ser. No. 217,181, with a series of major improvements and additions effective to reduce cost and increase flexibility and reliability of operation. Briefly, that system includes an alarm device operatively connected in series with a relay activated switch, the relay being connected in operative circuit arrangement with a pulse generator circuit adapted upon energization to provide rapid pulse activation of the relay and thus of the alarm device, in a manner similar to that described in the aforementioned copending application.

In a preferred embodiment both the vehicle horn and headlights are utilized as the alarm device, pulsed actuation providing a distinctive audible and visible alarm.

As in the system of my copending application, the pulse generator is actuated by a latching SCR after an inherent entrance delay in response to an alarm signal. That signal, in accordance with the system here disclosed, may be produced by either or both of two independent sensing circuits, one of which is substantially identical to the rate-of-change of battery voltage sensing circuit disclosed in my U.S. Pat. No. 3,671,934. The other sensing circuit is directly coupled to the hood circuit and/or a tamper circuit comprising a closed protective loop provided as original equipment on some late model vehicles. This D.C. coupled sensor circuit, besides activating the aforementioned SCR, also provides a substantially immediate activation of the pulse generator circuit, thereby bypassing the entrance delay. An additional circuit operatively connected to the entrance delay circuit is also effective to bypass the entrance delay when the cause of the alarm is other than the opening of a door. As a result, any tampering with the vehicle in an attempt to deactivate the electrical system or to gain entry other than by opening the door will provide an immediate alarm (if the vehicle doors are securely locked this may be all the protection which is needed). However, the entrance delay provides the authorized user sufficient time within which to enter the vehicle through the door and turn the ignition on. Once this occurs, the pulse generator circuit is immediately disabled preventing alarm activation during operation. At the same time the aforementioned SCR is unlatched by the battery voltage on the accessory line by means of a novel latching-/unlatching circuit.

That circuit comprises a depletion mode field effect transistor operatively connected in series with the latching SCR and effective to provide the necessary holding current therefor when the voltage at its gate terminal drops below a predetermined level. That gate terminal is operatively connected to the accessory line of the vehicle which is effective to impress 12 volts thereon upon switching of the ignition switch to either the accessory or ignition position thereby to render that FET nonconductive resulting in an elimination of the holding current necessary to maintain the SCR latched in its conductive condition. Upon disconnection of the accessory line from the battery voltage, the gate terminal of the FET is discharged to ground via an RC network with a large time constant, the time required to discharge that gate terminal below the threshold level constituting a relatively long exit delay.

As in the system described in my copending application, the alarm may be disarmed by turning the ignition switch to the accessory position and leaving it there for a predetermined period. However, in the present system this is accomplished in a much simpler and reliable way. Thus, the accessory line is operatively connected to the gate of a second SCR which when conductive is effective to short out the pulse generator circuit. However, in the ignition position of the ignition switch that SCR is bypassed by a parallel connected conductive transistor so that no current flows through the SCR and when the ignition is turned off the SCR, never having latched, remains nonconductive. If, however, the ignition switch is turned to the accessory position, the gate of the SCR remains energized while the base of the bypass transistor is discharged through an RC network. Once the bypass transistor is turned off (which takes approximately 5 seconds) current flows through the SCR latching same to disable the circuit. Upon subsequent use of the vehicle, the SCR is again unlatched by the bypass transistor.

An additional important feature of the invention is the automatic shutoff circuit which is operatively connected to the output of the pulse generator circuit and to the latching circuit RC network and is effective to charge the gate terminal of the latching FET through the battery in corresponding pulse increments. Upon reaching the threshold level (which may take approximately 5 minutes) the FET is rendered nonconductive unlatching the SCR and terminating the alarm. Thereafter, the gate terminal again discharges to ground rearming the circuit. As a result, the vehicle remains protected even after an attempted theft.

Another new feature of the present alarm system is the provision for a manual switch which, if activated prior to ignition shutoff or when the pulse generator circuit has been temporarily disarmed via the ignition switches as previously described, will permanently prevent the circuit from rearming thereafter until that switch is turned off. That switch is operatively connected to the aforementioned automatic shutdown circuit and is effective to prevent the gate terminal of the latching FET from discharging. The FET is thereafter maintained nonconductive until the switch is turned off regardless of the position of the ignition switch.

Finally, the present alarm system is provided with means to render the battery voltage sensor insensitive to voltage fluctuations while the headlights are on and for a fraction of a second after they are turned off. This feature effectively prevents false alarms in response to automatic headlight shutoff a given interval after the driver has exited the vehicle, as is the case in some late model automobiles.

Figure 2A:
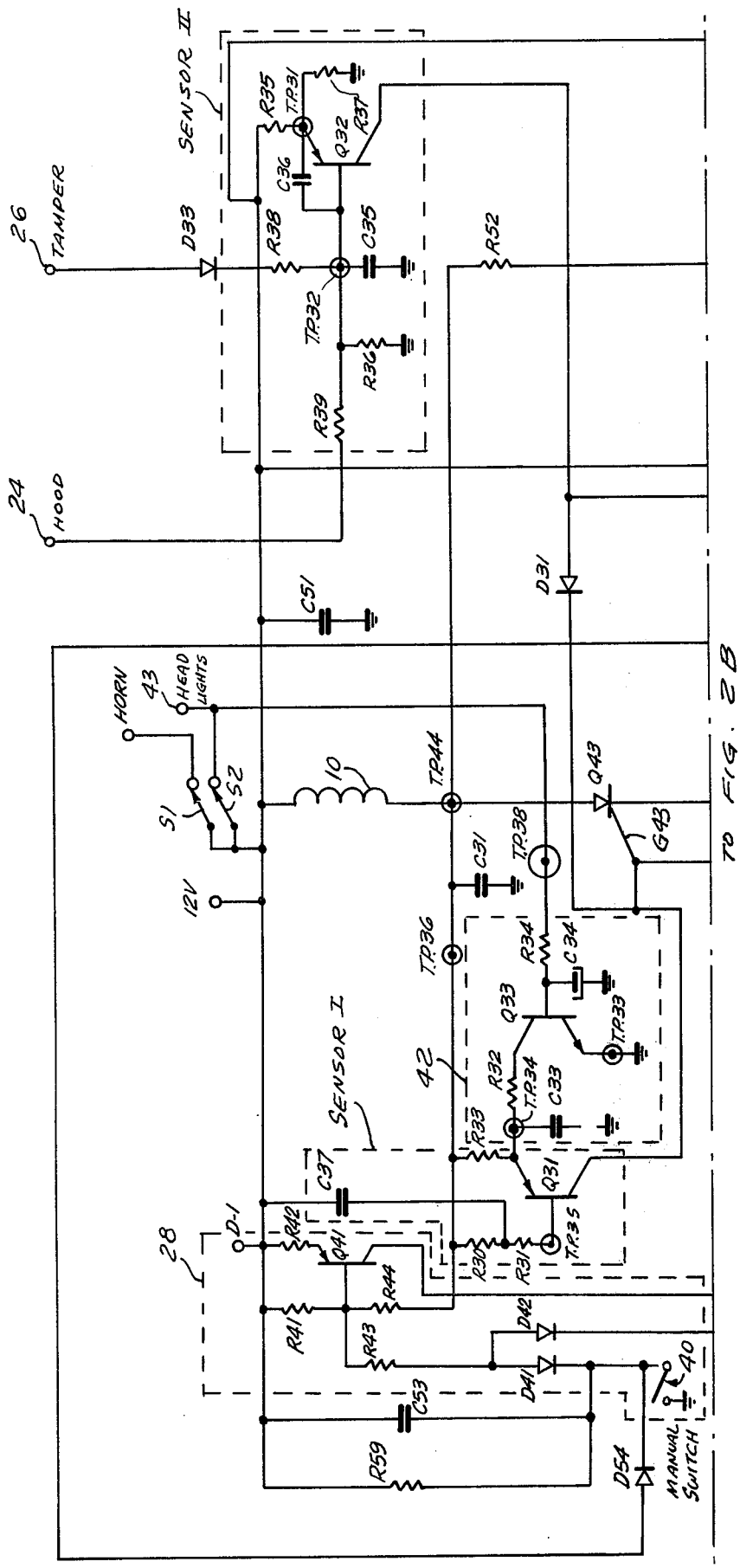

To the accomplishment of the above and to such other objects as may hereinafter appear, the present invention relates to an improved vehicle alarm system as defined in the appended claims and as described herein with reference to the accompanying drawings, in which:

FIG. 1 is a schematic block diagram, functional in nature, and illustrating the operation of the alarm system of the present invention; and FIGS. 2A and 2B together form a complete circuit diagram of the alarm system of the present invention.

The block diagram of FIG. 1 is purely functional in nature and is in essence a flow diagram illustrating by means of arrows and AND and OR logic functions (which do not necessarily correspond to specific circuitry in FIG. 2) the functional relationship between the various parts of the circuit and the operation thereof.

Referring to that schematic diagram, in the preferred embodiment of the invention, the alarm which is designed to attract attention to the vehicle is activated by a relay 10 and preferably comprises both the vehicle horn and headlights thereby to provide both a visual and audible signal. The relay 10 is in turn adapted to be activated in pulse fashion by a pulsate or pulse generator circuit 12, which is effective when actuated to rapidly open and close the relay thereby to provide a pulsed horn and headlight actuation of a readily distinguishable character. (It will of course be appreciated that the particular character of the alarm is a matter of choice, the horn and headlights being chosen because they are conveniently available on all vehicles.)

When the pulsate circuit 12 is armed by arm circuit 14, it will be energized upon unauthorized entry either by Sensor I or Sensor II as follows: Sensor I is responsive to the rate of voltage fluctuation at the positive battery terminal 13 (normally at 12 volts) and is designed to actuate a latch circuit 16 (through OR gate G2) upon sensing the energization of a resistive load device in the vehicle. Such energization may consist, for example, of the opening of a door or the trunk, both of which are normally accompanied by the energization of a courtesy light. If the intruder succeeds in entering the vehicle without energizing the door or trunk lights, Sensor I will still respond to the energization of any of the vehicle accessories (i.e., opening of glove compartment equipped with lamp, etc.).

Latch circuit 16 is effective to energize pulsate circuit 12 after a delay of approximately 15-20 seconds produced by entrance delay circuit 18, whereupon the alarm is activated hopefully calling attention to the intruder.

The 15-20 second delay provided by entrance delay circuit 18 allows the authorized driver to enter the vehicle and to turn on the ignition disarming the circuit in the manner hereinafter described. However, since the entrance delay is needed only for this purpose, the system is so designed that the entrance delay 18 is bypassed by an alternate bypass delay means 20 which will energize pulsate circuit 12 within a very short period (i.e., one second) after the latch circuit 16 is triggered, if the cause of the intrusion was not the opening of a door. Thus, as functionally illustrated in the drawing by AND gate G3 and OR gate G4, if the activation of latch circuit 16 coincides with a grounding of the door switch (the terminal 21 labeled "EXIT DOOR") then the entrance delay 18 will not be bypassed. If, however, upon activation of latch circuit 18, the exit door remains closed (terminal 22 remains at the 12-volt battery level), the pulsate circuit 12 is activated almost immediately (see gates G3, G4 and G1). (In actuality, as will hereinafter be described in detail in connection with FIG. 2, the bypass feature indicated by box 20 is incorporated in the entrance delay circuit itself.) This feature provides added protection, for example, for the trunk by providing a substantially instantaneous alarm upon being forced open. This feature, of course, requires the driver to enter the vehicle and disarm the alarm through the ignition switch prior to opening the trunk.

Sensor II is operatively connected directly to the HOOD circuit indicated by terminal 24 and to a closed circuit labeled TAMPER and indicated by terminal 26 which represents a protective closed loop or circuit provided in some late model automobiles to protect various areas of the vehicle, for example, the fuse block. Accordingly, Sensor II is adapted to sense either the opening of the hood or the tampering with or attack on various specified areas of the vehicle and in response to such hood opening or tampering is also effective to activate latch circuit 16 (through OR gate G2). Besides activating the latch circuit, Sensor II is also effective (through OR gate G4) to bypass both the latch circuit 16 and the entrance delay 18 and directly activate the pulsate circuit 12 substantially immediately upon the sensing of hood opening or other tampering of the vehicle (through OR gate G4, bypass delay 20 and OR gate G1). In either case, regardless of the cause of alarm actuation or of the delay involved, the pulsate circuit once activated will remain activated for as long as the latch circuit 16 remains latched.

Means are provided in the form of shutdown circuit 28 for unlatching the latch circuit 16 approximately 3-5 minutes after the alarm is initiated. This feature provides ample time for the attempted intrusion or theft to be detected and thwarted after which the alarm is automatically deactivated to prevent the battery voltage from being drained and also in consideration of those in the immediate area when the authorized driver is not available to shut the alarm off. (A police officer might resort to breaking the hood lock in order to disconnect the battery terminals to stop the alarm.) However, immediately after shutdown of the alarm, the latch circuit is again returned to a latching condition (through OR gate G5) such that a subsequent sensing of an intrusion by either Sensor I or Sensor II will again be effective to activate latch circuit 16.

As in the alarm system of my previous copending application Ser. No. 217,181, the arm circuit 14 is controlled through the ignition switch 30 illustrated in the lower right hand corner of the schematic diagram in FIG. 1. When the switch is in the ignition condition, both the ignition line 32 and the accessory line 34 are operatively connected to the 12-volt battery voltage and the pulsate circuit 12 is disarmed by the arm circuit 14. Upon switching from the ignition position to the off position both lines 32 and 34 are disconnected from the battery and arm circuit 14 is effective to automatically rearm the pulsate circuit 12 for subsequent actuation. The circuit may be disarmed prior to leaving the vehicle simply by turning the ignition switch to the accessory position which applies the 12-volt battery voltage to the accessory line 34 only, and which is effective to disarm the circuit and to maintain it disarmed after the switch is turned off. If the switch is switched directed from the ignition to the accessory position, then it is necessary to wait a predetermined interval (for example 5 seconds) to allow the ignition line 32 to discharge to ground after which the circuit will be disarmed. This feature also prevents inadvertent disarming of the circuit in vehicles in which the switch must go through the accessory position before being turned off.

When the accessory line 34 is connected to the battery voltage either in the ignition or accessory positions as shown in the diagram, the latch circuit 16 is also maintained in the unlatched condition via exit delay circuit 36 and OR gate G5. Upon switching of the ignition switch from the ignition to the off position, exit delay circuit 36 is effective through OR gate G5 to maintain the latch circuit 16 in the unlatched condition for approximately 60–120 seconds after which the circuit reverts to the latching condition. This provides the authorized driver with ample time to open the exit door. Once the exit door is opened grounding exit door terminal 21, the exit delay is suspended (bia AND gate G7) and does not resume until the door is closed. (In actuality, the operation of the exit delay circuit is reversed upon opening the door and if the door is maintained open long enough, the exit delay circuit 36 will be reset so that the full 60–120 seconds' delay will be provided upon subsequent closing of the door.)

The manual switch 40 provides a means for the driver to disable the alarm on a continuous basis as opposed to the one time arm prevention via the accessory position of the ignition switch without compromising the security of the system. Thus as illustrated functionally in FIG. 1, the switch will prevent arming of the circuit but will not turn off the alarm when armed. This is accomplished as follows: When the switch is turned to arm prevent, it is effective to prevent circuit 16 from latching (via OR gate G6) if not already latched—i.e., during operation or exit delay). This effectively prevents alarm actuation through Sensor I. In addition, switch 40 in the arm prevent mode directly disables Sensor II. However, it will be noted that if the latch circuit was armed, activation of the manual switch will not cause an immediate disarm. Thus the system is so designed that turning the manual switch to arm prevent triggers the alarm through Sensor I and the alarm will now sound for the 3–5 minute period before automatic shutdown. However, once the alarm is automatically shut off, it will not reset or rearm automatically in the arm prevent mode.

Finally, as illustrated in FIG. 1, I have provided a Sentinel disable circuit 42, the purpose of which is to maintain Sensor I insensitive as long as the headlights of the vehicle remain on and for a fraction of a second after they are turned off. This has been found necessary to prevent false alarms in vehicles which are equipped with the so-called sentinel option, whereby the headlights stay on for a period of 3–4 minutes after the ignition is shut off to illuminate the way. The sentinel disarm circuit 42 is designed to prevent false alarms from the transient associated with the automatic turn off of the headlights.

The specific circuitry by which all of the above is accomplished is illustrated in FIGS. 2A and 2B. Wherever appropriate, the specific subcircuits represented functionally in FIG. 1 are enclosed in broken lines in FIGS. 2A and 2B and designated by like reference numerals. (The designation T.P. stands for test point and is used throughout for convenience in describing the operative electrical connections and the operation of the circuit.)

The alarm itself is preferably provided by the horn and headlights which are activated by a pair of relay switches S1 and S2 controlled by relay 10. That relay is energized in response to the outputs of Sensors I and II.

SENSOR I

Referring specifically to FIG. 2A, the rate-of-change battery sensor circuit, here designated Sensor I, is substantially identical to that described in my aforementioned previous applications and comprises a sensing transistor Q31 having its emitter terminal T.P. 34 operatively connected to the 12-volt positive battery terminal 13 through resistors R33, R44 and R41. The base T.P. 35 of transistor Q31 is operatively connected to the positive battery terminal 13 through resistors R30 and R31 (connected in parallel with resistor R33 between T.P. 36 and the transistor). A capacitor C33 is operatively connected between the emitter T.P. 34 and ground, thereby forming an RC network with resistors R33, R44 and R41. The capacitor C33 charges up to substantially the full 12-volt battery voltage within seconds after the network is operatively connected. Thus, under normal conditions, when the circuit is armed and operating, the base T.P. 35 and emitter T.P. 34 of transistor Q31 are both at 12 volts, thereby slightly back biasing the transistor. When a sharp drop appears at the positive battery terminal 13 (such as would result from the energization of a resistive load across the battery terminals), it travels through resistors R41, R44, R30 and R31 and appears at base T.P. 35 substantially instantaneously. However, the appearance of the negative going pulse at emitter T.P. 34 is delayed by the interval necessary to charge capacitor C33 through the aforementioned RC network. As a result, if the pulse is of sufficient magnitude and sharpness, transistor Q31 will be rendered conductive, thereby to trigger SCR Q43 into conduction, provided the circuit in which its output terminals are connected is sufficiently conductive to provide a suitable holding current.

That circuit comprises relay 10 operatively connected in series with SCR Q43 and in parallel with resistors R41 and R44 between battery terminals 13 and T.P. 44. The gate terminal G43 of SCR Q43 is operatively connected to the collector of transistor Q31. As a result, upon conduction of transistor Q31 in response to a negative going pulse at battery terminal 13, capacitor C33 discharges through transistor Q31 into the gate terminal G43 of SCR Q43 triggering that SCR into conduction. The cathode of SCR Q43 is connected to ground through a zener diode D44 (the purpose of which will be explained hereinafter) and the output circuit of a P-channel depletion mode field effect transistor (FET) Q42. The conduction of that FET is modulated by the voltage level at its gate terminal G42. Accordingly, FET Q42 serves as a voltage controlled current source for SCR Q43, and when sufficiently conductive supplies the holding current necessary to latch SCR Q43 in its conductive condition. The voltage level at gate terminal G42 is determined by latching circuit 16 in a manner hereinafter described.

PULSATE CIRCUIT AND ENTRANCE DELAYS

The maximum current through FET Q42, while sufficient to latch SCR Q43, is insufficient to pull in relay 10. That relay is pulled in by the pulsate circuit 12 in a manner similar to that described in my previous copending application Ser. No. 217,181. The present circuit however includes an additional feature which provides an entrance delay which is conditioned upon the exit door condition. The condition of the exit door (which may be any or all of the vehicle doors) is manifested in the circuit by the voltage terminal labeled E.D. (corresponding to EXIT DOOR in FIG. 1) which is controlled by a door switch (not shown). When the doors are closed, that terminal is operatively connected to the 12-volt battery terminal and accordingly sits at 12 volts. If, on the other hand the door is opened, the doorswitch is grounded and terminal E.D. is drawn to ground.

As described in my aforementioned copending application, pulsate circuit 12 comprises a Darlington amplifier including a pair of transistors Q51 and Q52. The collectors of transistors Q51 and Q52 are operatively connected via line 48 to T.P. 45 in the output circuit of SCR Q43, the emitter of transistor Q51 is connected to the base of transistor Q52 and the emitter of transistor Q52 is connected to ground (T.P. 51). When a positive voltage is applied to the base of transistor Q51, the Darlington amplifier is fired to provide a low resistance path from T.P. 45 to ground thereby drawing sufficient current through SCR Q43 to pull in relay 10.

The base of transistor Q51 is operatively connected to the base B1 of unijunction transistor Q53 via diode D52 and resistor R54, unijunction transistor Q53 being adapted, upon triggering into conduction, to turn the Darlington pair of transistors Q51 and Q52 into saturation. The other base B2 of transistor Q53 is connected to the positive battery terminal 13 via resistor R52 which is operatively connected to relay 10 at T.P. 44. The base B1 is connected to ground via resistor R53 and the emitter T.P. 52 is connected to T.P. 45 through resistor R51. A capacitor C54 is connected between emitter T.P. 52 and ground, thereby together with resistor R51 providing an RC network having a relatively small time constant. A diode D53 operatively connects the emitter T.P. 52 to T.P. 53 at one side of a capacitor C21. The other side of capacitor C21 is operatively connected to the 12-volt battery terminal 13 via resistor R22. When the alarm is fully armed, the voltage at T.P. 53 is approximately one volt. Accordingly, an 11-volt potential difference normally appears across capacitor C21.

A capacitor C56 is operatively connected between the cathode of diode D52 and ground and is adapted to be charged up to a value exceeding the firing voltage of the Darlington amplifier upon the condition of unijunction transistor Q53. A resistor R55 is connected between the base of transistor Q51 and ground and provides together with resistor R54 a voltage division action to fire the Darlington amplifier. A capacitor C57 connected between the base of transistor Q51 and ground provides together with resistors R54 and R55 and capacitor C56 and RC network for firing the Darlington amplifier.

The circuit operates as follows: When the system is armed and in standby condition, the voltage at T.P. 45 is substantially zero, sensing transistor Q31 and SCR Q43 being off. Accordingly, the unijunction transistor Q53 also is nonconductive, the voltage at its emitter T.P. 52 also being substantially at zero.

When sensing transistor Q31 is momentarily turned on in response to a sharp dip in battery voltage at terminal 13, as previously described, the SCR Q43 is triggered and, assuming FET Q42 provides the necessary holding current, is latched in its conductive condition. As a result, current flows from positive battery terminal 13 through relay 10 and SCR Q43 to T.P. 45 and from T.P. 45 through resistor R51 to the emitter T.P. 52 of unijunction transistor Q53. As a result of the very low internal resistance of relay 10 relative to that of zener diode D44 and FET Q42, T.P. 45 immediately jumps to approximately 11 volts. The voltage at emitter T.P. 52 slowly climbs towards 8 volts at which point the unijunction fires. The time constant regulating the interval required for the voltage at T.P. 52 to reach 8 volts is determined by R51, C54 and C21. C21 has a much greater capacitance than C54 and accordingly the major portion of the time delay is taken up in discharging capacitor C21 (which it will be recalled normally has 11 volts thereacross) to bring T.P. 53 up to the required firing voltage (8 volts) for unijunction transistor Q53. The time required for this is preferably approximately 20 seconds. Upon the firing of unijunction transistor Q53, charge builds up on capacitor C56 and current flows through resistors R54 and R55 to ground. Those resistors are sized to provide a voltage at the base of transistor Q51 somewhat greater than the firing voltage of the Darlington pair of transistors Q51 and Q52. Accordingly, when capacitor C57 has been charged to the firing voltage, the Darlington pair is turned into saturation providing a low resistive path through lead 48 from T.P. 45 to ground. The voltage at T.P. 45 thus drops to approximately one volt, thereby pulling in relay 10 to close the switches S1 and S2 to provide the alarm.

As the voltage at T.P. 45 drops in response to conduction through the Darlington amplifier, the voltage at T.P. 52 drops below the valley voltage of unijunction transistor Q53 and that transistor is turned off. Diode D52 prevents capacitor C56 from discharging through resistor R53. The Darlington amplifier, accordingly, remains conductive until capacitor C56 is discharged through resistor R54 sufficiently to bring the voltage at the base of transistor Q51 below saturation. The on period of the Darlington amplifier defines the pulse width of alarm actuation and is determined in part by the time constant of capacitor C56 and resistor R54.

Upon the discharging of capacitor C56, the Darlington transistors Q51 and Q52 are turned off and the voltage at T.P. 45 jumps back to 11 volts, thereby turning off relay 10 and opening switches S1 and S2 to momentarily deactivate the alarm. Thereafter, current again flows through resistor R51 to charge the emitter T.P. 52 to the firing voltage. However, since T.P. 53 was maintained at the 8-volt firing voltage by back biased diode D53 during the initial firing of unijunction transistor Q53, the operative RC network for subsequently charging T.P. 52 comprises only resistors R51 and C54. As a result, since as previously noted, C54 is quite small, T.P. 52 is substantially instantaneously charged to the firing voltage of unijunction transistor Q53 thereby to fire that transistor and provide a new pulse cycle. The alarm will continue with a rapid pulsed actuation for as long as SCR 43 remains latched. Capacitor 57 connected between the base of transistor Q51 and ground is effective to prevent parasitic oscillation at that terminal.

Thus far it has been assumed that the only charging path for capacitor C21 is through diode D53 and resistor R51, thereby to provide an initial entrance delay of approximately 20 seconds. This condition remains true provided that T.P. 26 at the base of transistor Q21 is grounded, maintaining that transistor nonconductive. That condition obtains when the terminal E.D. is grounded by the opening of the exit door. Thus, if the driver enters the vehicle through the exit door, he has 20 seconds within which to turn on the ignition, thereby to disable the alarm in a manner hereinafter described. That is, if the firing of SCR Q43 coincides with the exit door line dropping to ground potential due to a door opening, T.P. 26 is immediately prevented from climbing above one volt due to diode D21 operatively connected between T.P. 26 and terminal E.D. Accordingly, transistor Q21 is rendered nonconductive. The purpose of resistor R21, capacitor C22 and diodes D24 and D22 is to maintain a fixed entrance delay of approximately 20 seconds regardless of how long the door is kept open. Thus, as soon as the door is open, capacitor C22 is discharged via D24. Even if the door is immediately closed again, capacitor C22 will not charge instantaneously, thus holding T.P. 26 down and preventing the transistor Q21 from instantly turning on.

If the alarm is not caused by the opening of a door and therefore the E.D. line remains at the 12-volt battery level, the following occurs. T.P. 22 is charged to the full 12-volt battery level and therefore the voltage at T.P. 26 follows the voltage at T.P. 45, there being no discharge path to ground. As a result, the moment that SCR Q43 latches, the voltage at T.P. 26 climbs almost instantaneously to 11 volts. This in turn discharges capacitor C21 by forcing 11 volts on T.P. 53, because transistor Q21 functions as an emitter follower. Diode D53 is now back biased (as would be the case after the first pulse) and the voltage at T.P. 52 climbs to the firing point of unijunction transistor Q53 within one second thereby to provide a substantially instantaneous alarm in the manner previously described. Thus, the 20-second entrance delay is effectively bypassed as long as the exit door remains closed.

ARMING CIRCUIT

As in my aforementioned copending application, the purpose of ARM circuit 14 is to temporarily disable the alarm circuit during normal operation of the vehicle and to rearm the circuit each time the ignition is switched off. In addition, the circuit may be disabled between uses of the vehicle through the accessory position of the ignition switch, as hereinafter described.

Referring specifically to the lower portion of FIG. 2B, it will be seen that arm circuit 14 comprises an SCR Q12 operatively connected in series with a diode D23 between T.P. 53 and ground. It will be appreciated that SCR Q12 when latched is effective to pull down the voltage at T.P. 53 and T.P. 52 (toward ground) on the emitter of the unijunction transistor Q53, thereby to completely disable pulsate circuit 12.

SCR Q12 is in turn triggered via the accessory line 34 to which its gate terminal is connected through diode D13 and resistor R12. Accordingly, when the ignition switch 30 is switched from the off to accessory position, 12 volts are impressed on accessory line 34, thereby to trigger SCR Q12 which latches in the conductive state thereby to disable pulsate circuit 12.

A shunting transistor Q11 is operatively connected to ground in parallel with SCR Q12 and accordingly when conductive will prevent SCR Q12 from latching in the conductive state. The base terminal of transistor Q11 is operatively connected to the ignition line 32 via resistor R13 and diode D14. As a result, when the ignition switch is turned from the off to the start or ignition condition, in addition to the battery voltage being impressed upon line 34, that voltage is also impressed upon ignition line 32 and caused transistor Q11 to conduct thereby shunting out SCR Q12. A capacitor C15 is operatively connected between T.P. 17 (defining the junction between resistor R13 and diode D14) and ground so that transistor Q11 will remain conductive for a short interval (preferably about 5 seconds) after the ignition switch is turned off. Thus, as long as the ignition switch is turned to the start or ignition position (ordinary operation of the vehicle), both SCR Q12 and transistor Q11 are conducting—transistor Q11 because of the voltage feed on the ignition line, and SCR Q12 because of the voltage feed on the accessory line. When the ignition switch is turned off, transistor Q11 remains conductive for five more seconds while SCR Q12, since it no longer has a voltage feed at its gate terminal, turns off. As a result, five seconds after ignition turn off, the voltage at T.P. 53 rises to 12 volts thus rearming the alarm. A resistor R15 is operatively connected between the base of transistor Q11 and ground and together with resistor R13 and capacitor C15 defines the RC network producing the five-second delay in turn off of transistor Q11. This five-second delay is necessary to account for dieseling wherein the accessory line might be sufficiently powered to trigger SCR Q12 immediately after ignition cut off. The voltage divider action of resistors R13 and R15 is designed to protect transistor Q11 from excessive ignition current. A resistor R14 is operatively connected between the gate terminal of SCR Q12 and ground and similarly, together with resistor R12, protects the SCR Q12 from excessive current on the accessory line 34. A bleeder resistor R16 is operatively connected between the accessory line 34 and ground at the anode side of diode D13 and serves to discharge any capacitance on that line.

Operatively connected to the collector of transistor Q11 via line 50 is a filter newtork comprising diode D11, resistor R11 and capacitor C11 operatively connected in series between the 12-volt battery terminal and ground together with a capacitor C12 operatively connected between T.P. 11 at the junction of diode D11 and resistor R11 and ground. The network is designed to prevent SCR Q12 from firing falsely when the 12-volt feed line is spiked. This network also prevents SCR Q12 from unlatching when the 12-volt feed line momentarily drops, such for example as might occur during engine starting.

LATCH CIRCUIT

The latching circuit 16 is designed to control the conditions under which an alarm can occur—that is, when SCR Q43 will be latched in the conductive condition thereby to trigger the pulsate circuit 12. As already noted, latching current is supplied to SCR Q43 by the depletion mode FET Q42 operatively connected between T.P. 46 and ground. The gate terminal G42 of that FET is operatively connected to a latching circuit network comprising a resistor R47 connected between the gate G42 and T.P. 47, a capacitor C43 operatively connected between T.P. 47 and ground, a resistor R48 operatively connected between T.P. 47 and T.P. 48, resistor R49 and capacitor C42 connected in parallel between T.P. 48 and ground, and diode D45 and resistor R46 operatively connected in series with each other and in parallel with resistor R48 between T.P. 47 and T.P. 48. This network is designed to provide charging and discharging time constants suitable to perform the following functions: (1) a 60-second exit delay during which SCR Q43 is prevented from latching, (2) a charging time delay of approximately five minutes initiated by the alarm itself and effective after such interval to unlatch SCR Q43, (3) an instantaneous reset as soon as the ignition is turned on, and (4) a means to manually permanently prevent SCR Q43 from latching if not already latched.

At the outset if should be noted that unusually long time constants may be provided utilizing fairly small components. This results from the use of a field effect transistor having an extremely high input impedance.

EXIT DELAY

As noted previously, FET Q42 is controlled by the voltage level at T.P. 47. As the voltage at T.P. 47 climbs towards 8 volts, the FET becomes less and less conductive between its source (T.P. 46) and its drain (at ground). Zener diode D44, by virtue of its breakdown characteristics, exhibits a 7-volt drop thereacross, thereby maintaining T.P. 46 at approximately 4 volts. Typically, when T.P. 47 reaches 8 volts, the current through FET Q42 drops below the holding current of SCR Q43, thereby unlatching SCR Q43 and shutting the alarm off automatically, or in the case where the alarm is not on, preventing the alarm from being activated thereafter. If the voltage at T.P. 47 is maintained at 8 volts or higher, SCR Q43 cannot latch. This is accomplished during ordinary operation of the vehicle when the accessory line 34 is energized by means of diode D47 operatively connected between accessory line 34 and T.P. 47. Thus, while the vehicle is being driven, 12 volts from the accessory line 34 charge capacitor C43. When the ignition is subsequently turned off, capacitor C43 discharges slowly through diode D45 and resistors R46, R38 and R49. The discharage rate is such that after 60 seconds the voltage at T.P. 47 has dropped from the 12 volts to which it was originally charged to the 8-volt threshold. As a result, the SCR Q43 is deprived of its holding current fro the initial 60 seconds, which effectively provides the desired exit delay after which the voltage at T.P. 47 drops below 8 volts and FET Q47 is adapted thereafter to provide holding current for SCR Q43. It should be noted that the resistor R47 operatively connecting T.P. 47 with gate G42 of FET Q42 has a resistance which is quite small compared to the resistance of that gate.

AUTOMATIC SHUTOFF

The latching circuit 16 also provides means for automatically shutting off the alarm after a given interval of time. This is accomplished by means of alarm shutdown network 28 which comprises a transistor Q41 operatively connected in series with resistor R42 between the 12-volt battery terminal 13 and T.P. 48. The base of that resistor is operatively connected to the junction between resistors R41 and R44. When the alarm is fully armed, capacitor C43 if fully discharged and the voltage at T.P. 48 is zero (there is no power on accessory line 34) and transistor Q41 is nonconductive. As the alarm is initiated, the Darlingtion amplifier begins flashing and T.P. 44 (at one side of relay 10) begins to swing between 12 volts (where it normally sits) and one volt. Since the base of transistor Q41 is operatively connected to T.P. 44 through resistor R44, that transistor is rendered conductive each time the relay 10 is pulled in (dropping T.P. 44 to one volt). Accordingly, capacitor C42 in latching circuit 16 is incrementally charged during each pulse actuation of the Darlington amplifier. The time constant of resistor R49 and capacitor C42 is quite large compared with the pulse rate of the Darlington amplifier so that after two or three pulses, T.P. 48 is fully charged to 12 volts and will remain at that level for as long as the relay keeps on flashing.

As a result, capacitor C43 (T.P. 47) begins to charge up via resistor R48. The time constant of this circuit is designed such that it takes approximately five minutes for capacitor C43 to reach 8 volts at which point, as previously noted, FET Q42 will not provide a holding current sufficient to maintain SCR Q43 latched. As a result, as soon as T.P. 47 reaches 8 volts, SCR Q43 unlatches thereby shutting the alarm off automatically. However, a few seconds later the voltage at T.P. 48 begins to drop towards zero and capacitor C43 discharges in a manner similar to that described in connection with the exit delay circuit. As a result, the alarm is effective to completely rearm within two to three minutes, whereby it is ready for the next disturbance.

MANUAL SWITCH

The circuit just described may also be utilized to provide a manual on/off switch designed to offer the authorized driver a way of permanently disabling the alarm system on a continuous basis as opposed to the one time alarm prevention via the accessory position of the ignition switch. It will be quite apparent that an ordinary on/off switch is not suitable, as it cannot be hidden from the well informed intruder, particularly as the alarm system herein described becomes more popular. The purpose of the manual switch accordingly is to prevent arming. As herein described, however, the switch will not turn off the alarm once armed.

As best illustrated in FIG. 2A, the manual switch 40 is operatively connected in series with resistor R43 and a diode D41 between the base of transistor Q41 and ground. In the arm prevent position, the switch is effective to operatively connect the base of transistor Q41 to ground thereby to render that transistor conductive. As a result, T.P. 48 is substantially immediately charged to 12 volts via conductive transistor Q41. If the system was not armed to begin with—that is, if T.P. 47 was at 8 volts or higher, the discharge path for capacitor C43 is effectively blocked and the circuit will thereafter be prevented from arming. If, on the other hand, the alarm system was fully armed, the activation of manual switch 40 will not cause an immediate shutoff of the system (it takes time to charge capacitor C43 to the cutoff voltage). Indeed, the system is so designed that turning the manual switch to arm prevent when the system is already armed is effective to trigger the alarm. This is accomplished by means of a capacitor C53 operatively connected in parallel with resistors R41, R43 and diode D41 and in parallel with resistor R59 between the battery supply terminal 13 and switch 40 so that turning of the manual switch to arm prevent provides a negative going spike generated by capacitor C53 and effective to trigger sensing transistor Q31 (Sensor I). The alarm accordingly will be activated in the manner already described (immediately since the E.D. terminal remains at 12 volts) and will continue for the five-minute period and will in the manner previously described automatically shut off. It will be appreciated, however, that the alarm will not automatically reset or rearm in the arm prevent mode after automatic shutoff because T.P. 48 will continue to supply 12 volts to hold T.P. 47 in the arm prevent mode. (If the switch 40 is switched to the arm prevent mode during the exit delay, the discharge capacitor C43 will immediately be halted and the system will not be armed after sixty seconds.)

SENTINEL DISABLE

As noted previously, many vehicles today come equipped with an option often referred to as the sentinel option which is effective to maintain the headlights operative for a short interval (typically 3–4 minutes) after the ignition has been turned off in order to illuminate the way. Accordingly, the battery voltage sensing circuit—Sensor I—may tend to be falsely activated in response to the transient associated with the alarm shutoff after the exit delay has expired and the system is fully armed, thereby to activate a false alarm. In order to insure against this possibility, I have provided a sentinel disable circuit 42 which comprises a transistor Q33 operatively connected in series with resistor R32 between T.P. 34 and ground and adapted when conductive to shunt sensing transistor Q31. The base terminal of transistor Q33 is operatively connected to the headlight circuit 43 via resistor R34. A capacitor C34 is operatively connected between T.P. 34 and ground and together with resistor R34 defines an RC network. When the headlights are on, transistor Q33 is rendered conductive and is effective to short out T.P. 34, thereby to render sensing transistor Q31 insensitive to voltage transients at the battery terminals. When the headlights are turned off, the base of transistor Q33 is maintained in conduction by the RC network defined by capacitor C34 for at least ten milliseconds, thereby to allow for contact bounce and transients to settle down before full sensitivity is attained by transistor Q31.

SENSOR II

While the rate-of-change of battery voltage sensing circuit—Sensor I—is particularly effective in sensing distrubances of the vehicle caused by energization of a resistive load device, it will be apparent that this sensor is deficient in a number of important respects. Thus a typical vehicle may be entered or tampered with in many respects which do not result in the energization of a resistive load device. Moreover, even when the intrusion or tampering does result in the energization of a resistive load device, the large entrance delay (approximately 20 seconds) inherent in the actuation of the pulsate circuit (when the cause of the alarm is the opening of an exit door) will in many cases afford the intruder sufficient time to abscound with something of value. As a result, it is desirable to completely bypass the entrance delay and latch circuit 16 and to provide an immediate alarm in response to said forms of tampering or intrusion. Primary among the locations on the vehicle which should be adequately protected by an instantaneous alarm is the hood since intruders often will take the precaution of opening the hood and disconnecting the battery in an effort to disable the alarm prior to stealing the vehicle or its contents. Remaining areas of the vehicle, such for example as windows, tires, etc., may be adequately protected by a protective loop circuit of a type well known in the prior art which upon being broken is adapted to actuate the alarm.

For this purpose I have provided a second sensing circuit—Sensor II—which comprises a transistor Q32 having its collector operatively connected to the gate terminal G43 of SCR Q43 via diode D31. The emitter T.P. 31 of transistor Q32 is operatively connected to the 12-volt battery line through resistor R35 and to ground through resistor R37. A capacitor C33 is operatively connected between the emitter T.P. 31 and the base of transistor Q32 and serves as a filter to slow down response. That base T.P. 32 is operatively connected to the hood circuit 24 via resistor R39 and to the tamper circuit (the aforementioned protective loop) through diode D33 and resistor R39. A capacitor C35 and a resistor R36 are operatively connected in parallel between T.P. 32 and ground. As thus described, the circuit is designed to supply a D.C. coupled signal to the gate of SCR Q43, thereby to activate the alarm in the manner already described when either the hood is opened or the protective loop defining the tamper circuit is broken. This is achieved as follows: Transistor Q32 is normally back biased as a result of the voltage divider action of resistors R35, R37, R38 and R56—that is, the voltage at the base T.P. 32, determined by resistors R38 and R36 is more positive than the voltage at the emitter T.P. 31, determined by resistors R35 and R37. When the hood is opened, terminal 24 (which is normally an open circuit) is grounded and the voltage at the base T.P. 32 of transistor Q32 drops below the emitter voltage (an additional path to ground through resistor R39 is provided) thereby rendering transistor Q32 conductive. As a result, approximately 10 volts appears on the gate G43 of SCR Q43 thereby triggering SCR Q43 into conduction. Likewise when the tamper circuit is broken, power is no longer supplied to terminal 26 and capacitor C35 (T.P. 32) discharges to ground turning on transistor Q32 with the same result.

As illustrated in FIGS. 2A and 2B, transistor Q32 when conductive also supplies 10 volts to T.P. 27 at the emitter of transistor Q21 (entrance delay circuit 18) through diode D55. As a result, as soon as transistor Q32 is switched on (by the opening of the hood or breaking of the tamper circuit), capacitor C21 is immediately discharged, thereby allowing the unijunction transistor Q53 to be fired substantially instantaneously in the manner previously described. It will therefore be appreciated that the opening of the hood or the breaking of the tamper circuit will substantially instantaneously initiate an alarm whether or not transistor Q42 supplies latching current to SCR Q43 and regardless of the condition of the exit door. Accordingly, this circuit effectively overrides both the entrance and exit delays. Indeed, the immediate discharge of capacitor C21 by the Sensor II circuit will provide for an instant alarm even when the circuit is in the middle of an entrance delay condition, initiated by the opening of the door. This feature is particularly important in vehicles which include a hood lock in the passenger compartment—the system cannot be avoided by opening the door and unlocking the hood. It will be noted, however, that the aforementioned charging path through diode D55 is shunted to ground in the arm prevent mode of manual switch 40 via lead line 60 (FIG. 2B) and diode D54 (FIG. 2A).

ALTERNATE ARMING PROCEDURE

The alarm system as described above incorporates an ignition controlled arming circuit for automatically rearming the alarm after each authorized use of the vehicle without the necessity of any positive action by the driver. As has already been noted, this feature is particularly attractive to insurance companies and together with the manual arm prevent feature incorporated herein provides a virtually foolproof vehicle security system which nevertheless provides a good deal of flexibility in controlling annoying false alarms. However, many vehicle owners would prefer to have an alarm system which will not automatically rearm but which can be armed by the driver when desired. Since the system herein described includes a considerable number of quite desirable features apart from the automatic arm feature, it would be desirable therefore to make the automatic arm feature optional. The arming circuit described above is so designed that this may be done at no extra cost with no change in design simply by reversing the connection of the ignition lead 32. Thus, referring to FIG. 2B, if the lead line 32 is connected to the accessory terminal only of the ignition switch and the lead line 34 is connected to both the accessory and ignition terminals, the arming and disarming functions are accomplished in a manner just the reverse of that previously described— the alarm is not automatic. Every time the ignition is turned off the alarm remains disabled. To arm the alarm, the ignition switch must be turned to the accessory position for five seconds before the key is removed. It will be noted that the circuit is identical and the desired arming procedure may be chosen at the time of installation in the vehicle.

It will be appreciated from all of the foregoing that I have provided an improved alarm system which represents a major advance in the vehicle security art. The system herein described is characterized by a number of unique and desirable features which combine to provide a vehicle warning system which is unusually effective and reliable in operation yet provides maximum convenience and flexibility at reasonable cost. As a result of the long entrance and exit delays, the possibility of false alarms is minimized and yet the entrance delay bypass feature insures that the security of the system is not compromised. By providing two independent sensing circuits substantially all modes of unauthorized intrusion and tampering can be detected.

The automatic arming feature described herein is embodied in a circuit which is relatively simple and inexpensive and may be converted to a non-automatic system merely by reversing a lead connection. The long time delays necessary for exit and automatic shutoff are both incorporated into a unique and particularly effective latch circuit utilizing a field effect transistor. Moreover, that same circuit is utilized to provide an additional arm prevent switch which allows the driver the convenience of permanently disarming the alarm without compromising the security of the system.

Finally, by another simple and inexpensive circuit, the particularly effective rate-of-change of battery voltage sensor may be adapted for use even with vehicles equipped with the sentinel option so as to insure against false alarms resulting from automatic headlight shutoff.

While only a limited number of embodiments of the present invention have been specifically disclosed herein, it will be apparent that many variations may be made therein, all within the scope of the invention, as defined in the following claims.

I claim:

1. For use in a vehicle having a power supply and an ignition switch having at least first, second and third operative positions, a vehicle alarm system for providing an alarm in response to unauthorized entry of the vehicle, comprising means producing an alarm signal in response to said unauthorized entry, alarm means, alarm energizing means connected in operative circuit arrangement with said alarm means, and adapted when activated to energize said alarm means to produce said alarm, means adapted to sense said alarm signal and effective, in response to an alarm signal so sensed, to activate said alarm energizing means, first and second lead lines, said ignition switch, in said first position, being adapted to connect said first lead line to said power supply, in said second position to connect said first and second lead lines to said power supply, and in said third position to disconnect said first and second lead lines from said power supply, disarm means operatively connected to one of said first and said second lead lines and to said alarm energizing means and adapted to be activated by said power supply and when so activated to disarm said alarm energizing means to prevent energization of said alarm, said disarm means, once activated, normally remaining latched in its activated condition to maintain said alarm disarmed, and means operatively connected to said second lead line to prevent said disarm means from latching when said ignition switch is in said second position.

2. The alarm system of claim 1, wherein said disarm means comprises a first switch means having a control terminal and an output circuit operatively connected to said alarm energizing means and adapted when conductive to disable said alarm energizing means, said control terminal of said first switch means being operatively connected to said one of said lead lines, and wherein said latch prevent means comprises a second switch means having a control terminal and an output circuit operatively connected to said alarm energizing means in parallel with said first switch means, the control terminal of said second switch means being operatively connected to the other of said lead lines, said first switch means when its control terminal is operatively connected to said power supply being adapted to latch provided sufficient holding current flows therethrough, said second switch means when conductive depriving said first switch means of its holding current thereby to prevent said first switch means from latching.

3. The alarm system of claim 2, wherein said first switch means comprises a silicon controlled rectifier.

4. The alarm system of claim 2, further comprising capacitive storage means and resistive means operatively connected in parallel between said control terminal of said second switch means and ground, whereby when said ignition switch is switched out of said second position said second switch means is maintained conductive for an interval determined by the time required to discharge said capacitive storage device through said resistive means.

5. A vehicle alarm system for use in a vehicle having a power supply and headlights comprising an alarm, sensing means operably connected to the power supply for generating an alarm signal upon the energization of a resistive load device, means operatively connected to said alarm for activating said alarm in response to said alarm signal, delay means operably connected between said activating means and said sensing means for delaying said alarm signal generated by said sensing means, switch means operably connected to at least one of the doors of the vehicle, means operably connected to said switch means to disable said delay means when at least one door remains closed, and means operably connected to said sensing means and to said headlights to disable said sensing means while said headlights are on and for a short interval after said headlights are shut off.

* * * * *